United States Patent [19]
Gaeta et al.

[11] Patent Number: 5,896,275
[45] Date of Patent: Apr. 20, 1999

[54] GROUND AND SHIELD FOR A SURFACE ACOUSTIC WAVE FILTER PACKAGE

[75] Inventors: Anthony J. Gaeta, Clifton; Walter J. Picot, Randolph, both of N.J.

[73] Assignee: Lucent Technologies Inc., Murray Hill, N.J.

[21] Appl. No.: 08/982,052

[22] Filed: Dec. 1, 1997

[51] Int. Cl.[6] .................................................. H05K 5/03
[52] U.S. Cl. ..................... 361/760; 361/816; 361/818; 361/822; 361/765; 361/772; 361/758; 361/785; 439/92; 439/95; 439/96; 439/101; 439/108; 439/111; 439/610; 439/608
[58] Field of Search ........................... 361/760, 816, 361/818, 822, 765, 772, 758, 785; 439/92, 95, 96, 101, 108, 111, 610, 608

[56] References Cited

U.S. PATENT DOCUMENTS

| | | | |
|---|---|---|---|
| 5,246,388 | 9/1993 | Collins et al. | 439/620 |
| 5,459,368 | 10/1995 | Onishi et al. | 310/313 R |
| 5,483,407 | 1/1996 | Anastasio et al. | 361/56 |
| 5,496,183 | 3/1996 | Soes et al. | 439/79 |
| 5,506,552 | 4/1996 | Seki et al. | 333/195 |

*Primary Examiner*—Leo P. Picard
*Assistant Examiner*—David Foster

[57] ABSTRACT

A grounding member for installation between a surface acoustic wave filter package and a circuit board to which the filter package is mounted. The grounding member is formed from electrically conductive sheet stock material as a leaf spring which is deformed to maintain effective contact between the outer case of the filter package and a ground plane on the circuit board. In addition to providing an effective ground connection between the filter package and the ground plane, the grounding member also functions as an electromagnetic shield for radiating signals between the input signal post and the output signal post of the filter package.

7 Claims, 2 Drawing Sheets

GROUND AND SHIELD FOR A SURFACE ACOUSTIC WAVE FILTER PACKAGE

BACKGROUND OF THE INVENTION

This invention relates to the mounting of a surface acoustic wave filter package to a circuit board and, more particularly, to improved grounding and effective input to output shielding of such a package.

Surface acoustic wave filters are commonly used as bandpass filters in electronic devices. Such a filter is usually packaged within an outer metal case having a substantially planar base out of which extend posts for mounting to a circuit board and for providing interconnections between the filter and traces on the circuit board. Typically, there is an input signal post insulated from the metal case, an output signal post insulated from the metal case, and one or more ground posts connected to the bases These posts extend through respective apertures in the circuit board, as is conventional, and the package is secured to the circuit board by soldering the posts to respective traces on the board. In addition, the circuit board typically has a ground plane on its upper surface for direct contact by the package base. A problem with this construction and mounting is that circuit boards usually have imperfections which result in the formation of a gap between the planar base of the filter package and the ground plane on the board. This gap provides a sneak path under and around the filter package for a portion of the input signal which is radiated from the input signal post and received by the output signal post Thus, part of the signal appears unfiltered at the output signal post, thereby lowering the efficiency of the filter. It would therefore be desirable to eliminate this sneak path.

Prior attempts to solve this problem have utilized a full body ground gasket or have soldered the entire periphery of the package to the ground plane on the board. Both of these methods are undesirable since they are difficult to implement and/or cause unacceptable damage to both the package and circuit board when repair is necessary. It would therefore be desirable to provide an effective shield and ground which does not suffer from these disadvantages.

SUMMARY OF THE INVENTION

The foregoing and additional objects are attained in accordance with the principles of this invention by providing an electrically conductive grounding member which is formed from a piece of sheet stock material having a major axis into a shape which is concave in section orthogonal to the major axis. During assembly, the grounding member is placed between the base of the filter package and the circuit board and is positioned between the input and output signal posts, with the ends of the grounding member extending beyond the periphery of the filter package base. The filter package is pressed against the circuit board to deform the grounding member. The deformed grounding member acts as a spring to exert a force against the base and the circuit board sufficient to maintain the grounding member in contact with both the base and the ground plans on the circuit board. With the grounding member taking up the gap between the filter package and the circuit board, the grounding member acts as a shield to prevent electromagnetic radiation from the input signal post reaching the output signal post, as well as assuring effective grounding of the package case to the ground planes.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
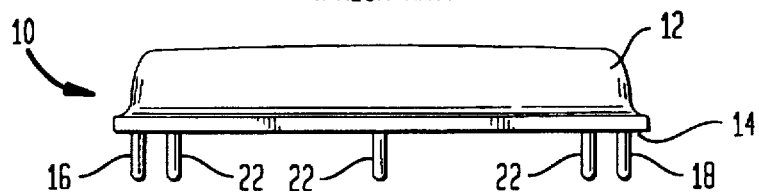
FIG. 1 is a side view of a typical surface acoustic wave filter package with which the present invention finds utility.
Figure 2:
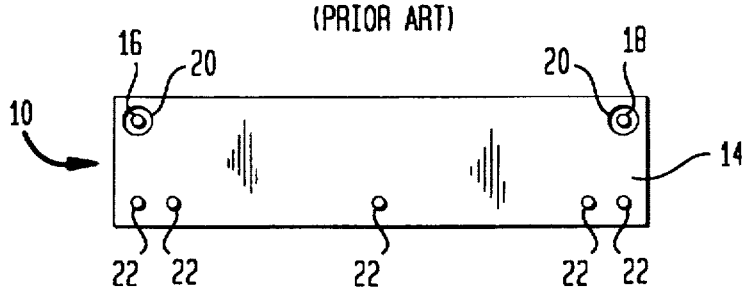
FIG. 2 is a bottom plan view of the package shown in FIG. 1.

Referring now to the drawings, FIGS. 1 and 2 show a typical prior art surface acoustic wave filter package, designated generally by the reference numeral 10. The package 10 includes an electrically conductive outer case 12 having a substantially planar base 14. The outer periphery of the base 14 is rectangular, as shown in FIG. 2. The package 10 further includes an input signal post 16 extending out of the base 14 and orthogonal to the base 14, and an output signal post 18 extending out of the base 14 and orthogonal to the base 14. The posts 16, 18 are connected to circuitry within the case 12 and are insulated from the base 14 by glass beads 20 or the like, as is conventional. A plurality of ground posts 22 also extend out of the base 14 orthogonal thereto. The ground posts 22 are connected to the base 14 and also extend into the case 12 to provide grounding connections for the package 10 and the circuitry contained therein.

Until now, the filter package 10 has been installed on a circuit board by inserting the posts 16, 18, 22 through respective circuit board apertures and then soldering the posts to ground and circuit traces on the board to both provide electrical interconnections and to secure the package 10 to the board. The surface of the circuit board on which the package 10 is mounted also has a ground plane thereon, and it has been expected that the package base 24 will contact this ground plane to effectively ground the package case 12. However, due to imperfections in the surface of the circuit board, gaps remain between the base 14 and the ground plane on the circuit board. These gaps provide a sneak path between the input signal post 16 and the output signal post 18 so that a portion of the input signal applied to the input signal post 16 is radiated from the post 16 and received by the post 18. This received signal is additive to the filtered signal which has passed through the circuitry within the package 10 and, since it is not filtered, lowers the efficiency of the filter.

Figure 3:
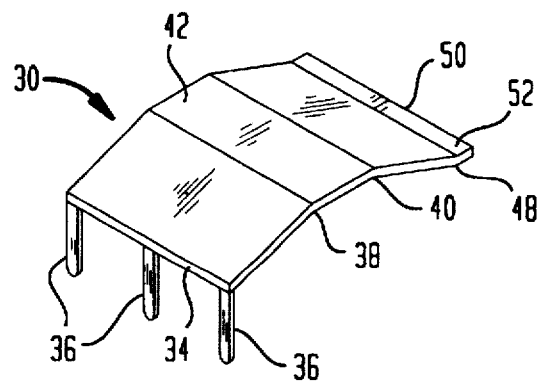
FIG. 3 is a perspective view of an illustrative grounding member constructed in accordance with the principles of this invention.
Figure 4:
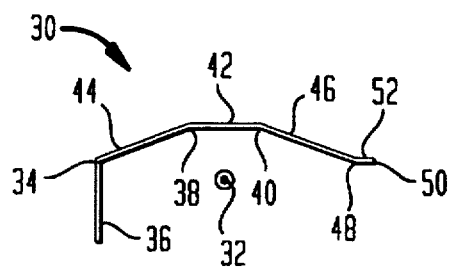
FIG. 4 is an and view of the grounding member shown in FIG. 3.

To overcome this problem without utilizing a full body ground gasket or soldering the package to the ground plane on the circuit board, the present invention provides a grounding member, an illustrative embodiment of which is shown in FIGS. 3 and 4 and is designated generally by the reference numeral 30. The grounding member 30 is formed from a piece of electrically conductive sheet stock material, preferably phosphor-bronze plated with nickel and covered by gold plate, and approximately 5 mils thick. The sheet stock material is rectangular, having a major axis 32 parallel to an edge 34, with at least one finger 36 extending from the edge 34. To shape the grounding member 30, the piece of sheet stock material is preferably bent along the bend lines 38, 40, which are parallel to the major axis 32. This results in the formation of a planar central portion 42 flanked by a pair of lateral portions 44, 46. Also, the piece of sheet stock material is preferably bent along the bend line 48, which is close to the edge 50 opposite the edge 34, in the opposite direction from the bends at the bend lines 38, 40 to form a terminal portion 52 curved upwardly so that during installation the edge 50 does not dig into the surface of the circuit board, as will be explained in full detail hereinafter. Finally, the fingers 36 are bent at the edge 34 so that they are orthogonal to the central portion 42. Thus, the grounding member 30 is shaped to be concave in section orthogonal to the major axis 32, as best shown in FIG. 4.

Figure 5:
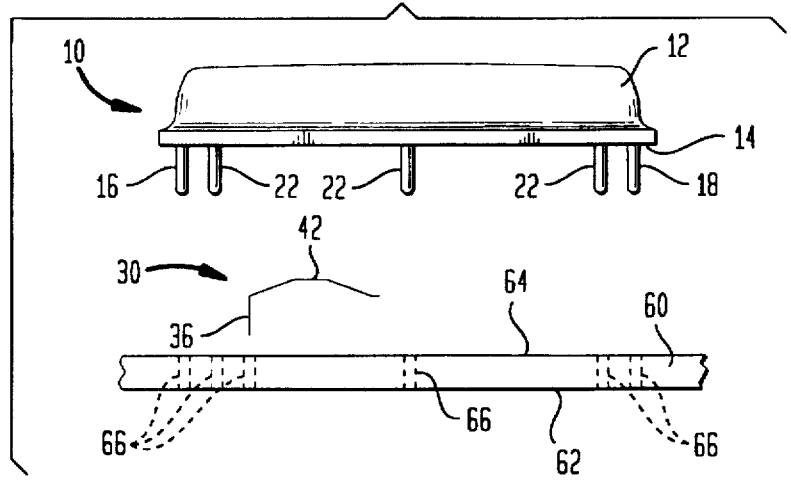
FIG. 5 is a side view showing the relative placement of the filter package, grounding member and circuit board prior to final assembly.

Referring to FIG. 5, the package 10 is adapted for mounting to the circuit board 60. The lower surface 62 of the circuit board has deposited thereon ground and circuit traces, as is conventional. The upper surface 64 of the circuit board 60 has deposited thereon a conductive ground plane, as is conventional. Further, the circuit board 60 is formed with a plurality of apertures 66, as is also conventional, to receive therethrough the posts 16, 18, 22 of the package 10 and the fingers 36 of the grounding member 30.

Figure 6:
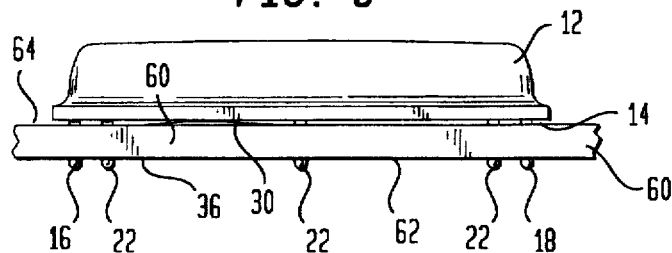
FIG. 6 is a side view similar to FIG. 5 showing the components after assembly.

For assembly, the grounding member 30 is oriented so that its concavity is open to the upper surface 64 of the circuit board 60 and its fingers 36 are inserted into respective ones of the apertures 66 provided therefor. The grounding member 30 is preferably oriented with the major axis 32 being orthogonal to a line joining the posts 16, 18. The package 10 is then placed over the grounding member 30 with its posts 16, 18, 22 inserted into respective ones of the apertures 66. The package 10 is then pressed toward the circuit board 60, as shown in FIG. 6, sufficiently to deform (i.e., flatten) the grounding member 30. The upward bending at the bend line 48 of the grounding member 30 keeps the edge 50 from digging into the ground plane on the surface 64 as the grounding member 30 is flattened. The package 10, along with the grounding member 30, are secured to the circuit board 60 by soldering the posts 16, 18, 22 and the fingers 36 to respective ones of the circuit and ground traces on the lower surface 62.

Figure 7:
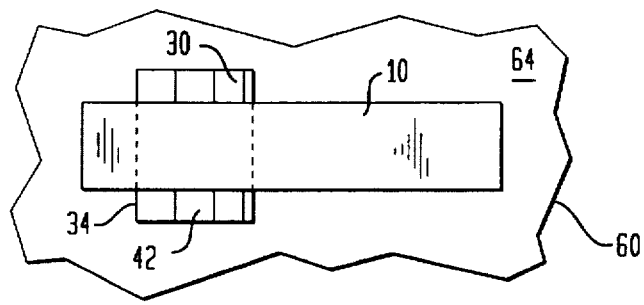
FIG. 7 is a top plan view of the components shown in FIG. 6.
Figure 8:
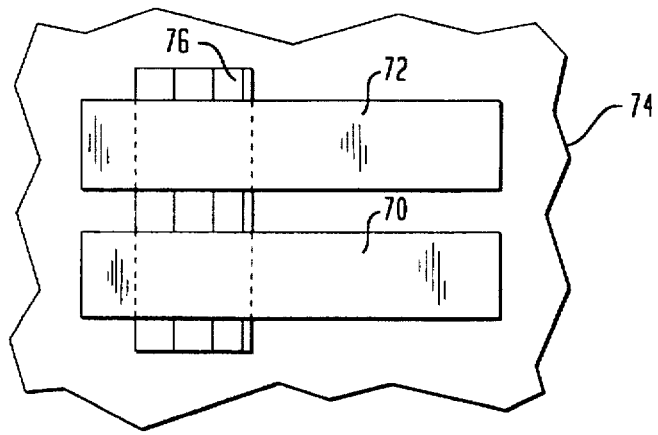
FIG. 8 is a top plan view similar to FIG. 7 showing the mounting of a pair of filter packages side-by-side with a single grounding member.

The deformation of the grounding member 30 results in the grounding member 30 acting as a spring to exert a force against both these package base 14 and the ground plane on the circuit board 60 to maintain the grounding member 30 in contact with both the package base and the ground plane, thereby insuring that the outer case 12 of the package 10 is properly grounded. It has been found that a suitable contact force to maintain the aforedescribed contact is achieved by using the aforedescribed 5 mil thick sheet stock material where the distance between the edges 34 and 50 is approximately 450 mils and the distance between the central portion 42 and a line joining the edge 34 and the bend line 48 is approximately 45 mils. The length of the grounding member 30 along the major axis 32 is sufficient so that the grounding member 30 extends beyond opposing peripheral portions of the package bass 14 by approximately 50 mils, as shown in FIG. 7. As illustrated in FIG. 8, if a pair of filter packages 70, 72 are mounted side-by-side on a circuit board 74, a single grounding member 76 extending approximately 50 mils beyond opposing peripheral edges of the filter packages 70, 72 may be utilized.

It has bean found that placement of the grounding member 30 closer to the input signal post 16 then to the output signal post 18 is most effective. It is believed that this placement of the grounding member 30 is more effective because it includes a greater angle relative to the radiation from the input signal post 16 than if the grounding member 30 were closer to the output signal post 18.

The aforedescribed construction provides a number of advantages. It insures good contact between the outer case of the filter package and the circuit board ground plane. Further it acts as a shield to prevent a radiating signal from the input signal post 16 from sneaking around and under the filter package to the output signal post 18. Also, the ground spring is easy to manufacture and is easily installed, while allowing for easy disassembly for repair purposes. Further, only one such grounding member is needed per filter package and a single grounding member may be sufficient for a plurality of filter packages.

Accordingly, there has been disclosed a construction which leads to improved grounding and effective input to output shielding of a surface acoustic wave filter package mounted to a circuit board. While an illustrative embodiment of the present invention has been disclosed herein, it is understood that various modifications and adaptations to the disclosed embodiment will be apparent to those of ordinary skill in the art and it is intended that this invention be limited only by the scope of the appended claims. For example, the grounding member can be shaped as a continuous curve, rather than a series of adjacent planar portions. In addition, the grounding member may be installed with its concavity directed toward the filter package instead of toward the circuit board, provided that the mounting fingers are modified.

What is claimed is:

1. In combination:

a circuit board having apertures therethrough, a ground plane on a first surface thereof, and ground and circuit traces separated and insulated from said ground plane;

a surface acoustic wave filter package having:

an electrically conductive outer case with a planar base;

an input signal post extending out of said base orthogonal to said base and insulated from said base; and an output signal post extending out of said base orthogonal to said base, insulated from said base and spaced from said input signal post;

wherein said signal posts are adapted for insertion through respective apertures of said circuit board while insulated from said ground plane to mount said package to said circuit board first surface above said ground plane and provide electrical interconnections between said package and said circuit traces; and an electrically conductive grounding member between said package case base and said circuit board ground plane, wherein said grounding member is formed from a piece of electrically conductive sheet stock material having a major axis, said grounding member is shaped to be concave in section orthogonal to said major axis, said grounding member is positioned between and separated from said signal posts with said major axis being orthogonal to a line joining said posts, the dimension of said grounding member along said line joining said posts is less than the distance between said posts, and said grounding member extends along said major axis beyond opposing peripheral portions of said base;

wherein when said package is mounted to said circuit board first surface above said ground plane, said grounding member is deformed to block signal radiation between said posts and to exert a force against said base and said circuit board ground plane sufficient to maintain said grounding member in contact with both said base and said circuit board ground plane.

2. The combination according to claim 1 wherein said grounding member includes a finger extending from a peripheral edge thereof and adapted for insertion through an aperture of said circuit board to provide an electrical interconnection between said grounding member and said ground trace.

3. The combination according to claim 1 wherein the concavity of said grounding member is open to said circuit board.

4. The combination according to claim 3 wherein said grounding member is bent along at least two lines parallel to said major axis to provide a planar portion parallel to said base for contacting said base.

5. The combination according to claim 4 wherein said grounding member piece of sheet stock is rectangular with a pair of peripheral edges parallel to said major axis and said pair of peripheral edges lie in a plane parallel to said planar portion.

6. The combination according to claim 5 wherein said grounding member includes at least one finger extending from one of said pair of peripheral edges and adapted for insertion through at least one respective aperture of said circuit board to provide an electrical interconnection between said grounding member and said ground trace.

7. The combination according to claim 1 wherein said grounding member is positioned closer to said input signal post than to said output signal post.

* * * * *